(12) United States Patent
Desai et al.

(10) Patent No.: US 10,090,057 B2
(45) Date of Patent: Oct. 2, 2018

(54) DYNAMIC STROBE TIMING

(71) Applicant: SanDisk Technologies LLC, Plano, TX (US)

(72) Inventors: Amul Desai, Milpitas, CA (US);
Khanh Nguyen, San Leandro, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/440,940

(22) Filed: Feb. 23, 2017

(65) Prior Publication Data
US 2018/0240526 A1 Aug. 23, 2018

(51) Int. Cl.
| | |
|---|---|
| *G11C 7/22* | (2006.01) |
| *G11C 16/32* | (2006.01) |
| *G11C 16/24* | (2006.01) |
| *G11C 7/10* | (2006.01) |

(52) U.S. Cl.
CPC .............. *G11C 16/32* (2013.01); *G11C 16/24* (2013.01); *G11C 7/1051* (2013.01); *G11C 7/1066* (2013.01); *G11C 7/22* (2013.01)

(58) Field of Classification Search
CPC ........ G11C 7/22; G11C 7/1066; G11C 7/1051
USPC ......................................................... 365/193
See application file for complete search history.

(56) References Cited

U.S. PATENT DOCUMENTS

| | | | |
|---|---|---|---|
| 4,797,850 A | 1/1989 | Amitai | |
| 4,812,769 A | 3/1989 | Agoston | |
| 6,295,413 B1 * | 9/2001 | Ogasawara | G03B 15/05 327/101 |
| 6,316,980 B1 | 11/2001 | Vogt et al. | |

* cited by examiner

*Primary Examiner* — Jason Lappas
(74) *Attorney, Agent, or Firm* — Kunzler, PC

(57) ABSTRACT

Apparatuses, systems, methods, and computer program products are disclosed for dynamic strobe timing. A controller is configured to generate a strobe signal to facilitate data transfer. A controller is configured to receive a feedback signal in response to initiation of a strobe signal. A controller is configured to control a duration of a strobe signal based on a feedback signal.

22 Claims, 13 Drawing Sheets

_US 10,090,057 B2_

DYNAMIC STROBE TIMING

TECHNICAL FIELD

The present disclosure, in various embodiments, relates to strobe signals for facilitating data transfer and more particularly relates to dynamic timing for strobe signals.

BACKGROUND

Many electrical circuits and devices, such as data storage devices or the like, use strobe signals. A strobe signal may be supplied to sensing circuitry to control a duration (e.g., length of time) used by the sensing circuitry to sense the data stored in a storage cell, for example. Excessive duration of a strobe signal may result in excessive sensing time, increased power consumption, and/or reduced sensing accuracy.

SUMMARY

Apparatuses are presented for dynamic strobe timing. In one embodiment, an apparatus includes a controller. A controller, in certain embodiments, is configured to generate a strobe signal to facilitate data transfer. A controller, in one embodiment, is configured to receive a feedback signal in response to initiation of a strobe signal. In some embodiments, a controller is configured to control a duration of a strobe signal based on a feedback signal.

An apparatus, in certain embodiments, includes a node driver configured to drive a sense amplifier node to an initial voltage. An apparatus, in one embodiment, includes a strobe enabling transistor configured to receive a strobe signal to facilitate reading memory cells of a set of non-volatile memory cells with a node at an initial voltage. In some embodiments, an apparatus includes a strobe driver configured to provide a strobe signal to a strobe enabling transistor. In various embodiments, an apparatus includes a comparator configured to compare a voltage at a node with a bias voltage. In certain embodiments, in response to a voltage at a node passing a threshold voltage, a comparator is configured to output a control signal to a strobe driver to end providing a strobe signal to a strobe enabling transistor.

Methods are presented for dynamic strobe timing. A method, in one embodiment, includes receiving a voltage change at a node in response to application of a strobe signal. In various embodiments, a voltage change at a node changes a voltage at the node from an initial voltage to a transient voltage. In a further embodiment, a method includes comparing a transient voltage to a bias voltage. A method, in certain embodiments, includes controlling a length of a strobe signal based on a comparison between a transient voltage and a bias voltage.

An apparatus for dynamic strobe timing, in one embodiment, includes means for detecting a voltage change at a node in response to initiation of a strobe signal. In certain embodiments, a voltage change at a node changes a voltage at the node from an initial voltage to a transient voltage. In some embodiments, an apparatus includes means for determining a relationship between a transient voltage and a threshold voltage. In various embodiments, an apparatus includes means for terminating a strobe signal based on a relationship between a transient voltage and a threshold voltage.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
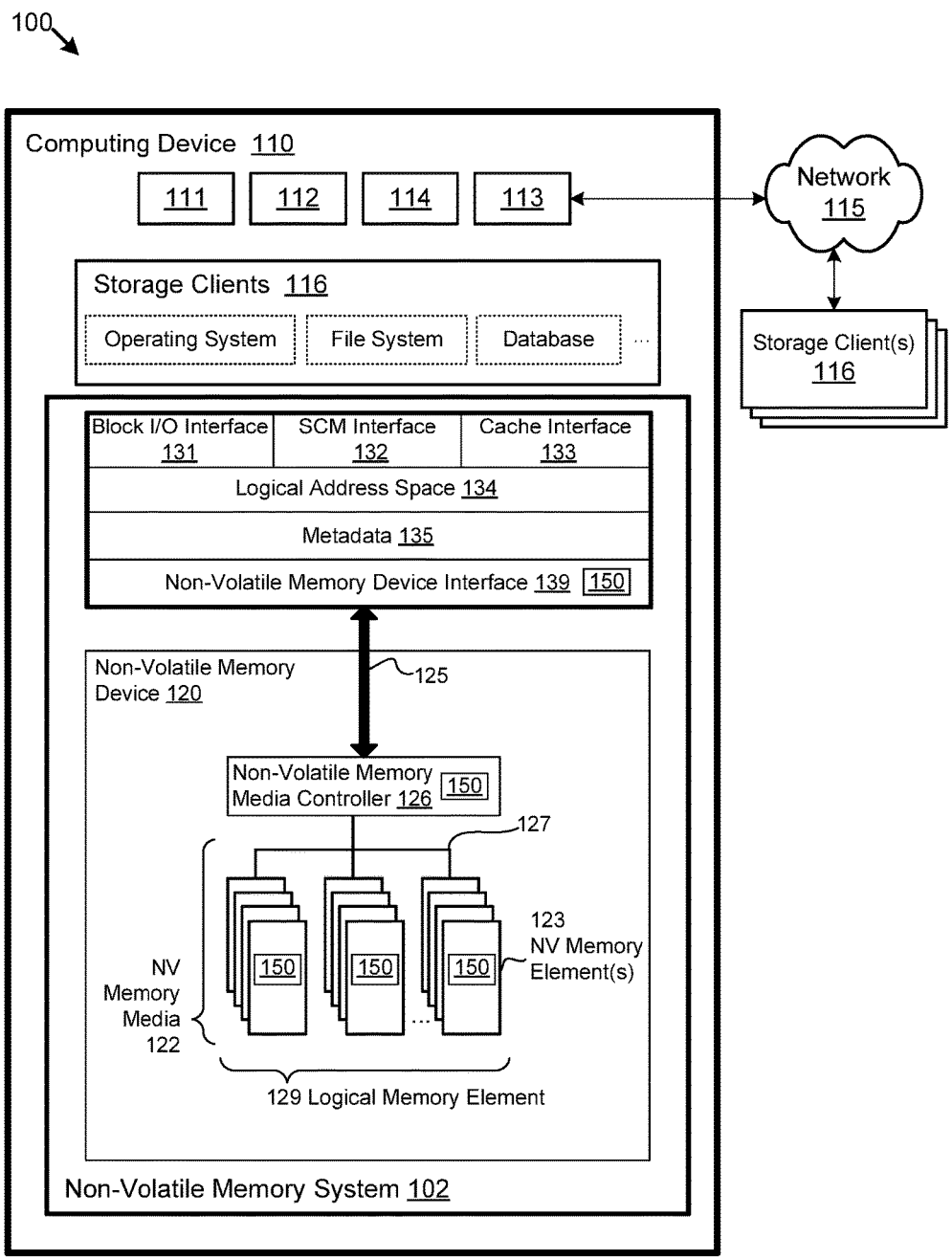
FIG. 1A is a schematic block diagram illustrating one embodiment of a system for dynamic strobe timing.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a dynamic strobe component 150 for a non-volatile memory device 120. The dynamic strobe component 150 may be part of and/or in communication with a non-volatile memory media controller 126, a non-volatile memory element 123, a device driver, or the like. The dynamic strobe component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the dynamic strobe component 150 may be embodied as one or more computer readable instructions stored on the non-transitory storage medium 114.

The non-volatile memory system 102, in the depicted embodiment, includes a dynamic strobe component 150. The dynamic strobe component 150, in one embodiment, is configured to manage dynamic strobe timing (e.g., a duration of a strobe signal) for the non-volatile memory device 120 described below. The dynamic strobe component 150, in certain embodiments, may receive a voltage change at a node in response to application of a strobe signal. In some embodiments, the voltage change at the node changes a voltage at the node from an initial voltage to a transient voltage. The dynamic strobe component 150 may also compare the transient voltage to a bias voltage. The dynamic strobe component 150 may control a duration (e.g., length of time) of the strobe signal based on the comparison between the transient voltage and the bias voltage. Thus, a duration of a strobe signal may be dynamically controlled.

In one embodiment, the dynamic strobe component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the dynamic strobe component 150 may comprise executable software code, such as a device driver or the like, stored on the computer readable storage medium 114 for execution on the processor 111. In a further embodiment, the dynamic strobe component 150 may include a combination of both executable software code and logic hardware.

In one embodiment, the dynamic strobe component 150 is configured to receive storage requests from a device driver or other executable application via a bus 125 or the like. The dynamic strobe component 150 may be further configured to transfer data to/from a device driver and/or storage clients 116 via the bus 125. Accordingly, the dynamic strobe component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the dynamic strobe component 150 may receive storage requests as an API call from a storage client 116, as an IO-CTL command, or the like.

According to various embodiments, a non-volatile memory controller 126 in communication with one or more dynamic strobe components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device 110 interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
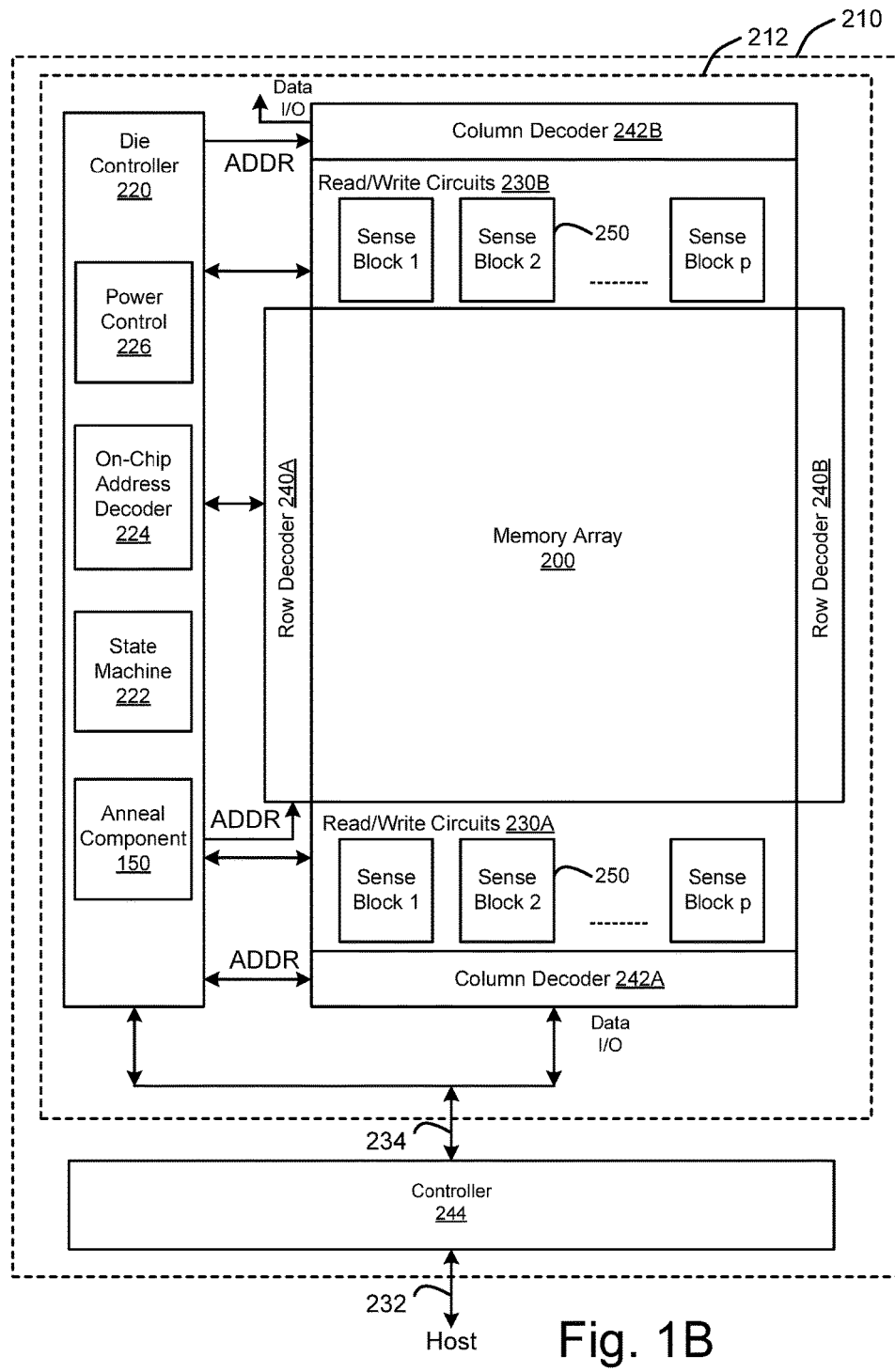
FIG. 1B is a schematic block diagram illustrating another embodiment of a system for dynamic strobe timing.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a dynamic strobe component 150, a state machine 222, and an on-chip address decoder 224. In one embodiment, the state machine 222 comprises at least a portion of the dynamic strobe component 150. In a further embodiment, the controller 244 comprises at least a portion of the dynamic strobe component 150. In various embodiments, one or more of the sense blocks 250 comprises at least a portion of the dynamic strobe component 150.

The dynamic strobe component 150, in one embodiment, is configured to generate a strobe signal to facilitate data transfer, receive a feedback signal in response to initiation of the strobe signal, and control a duration of the strobe signal based on the feedback signal.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the dynamic strobe component 150. The dynamic strobe component 150, in some embodiments, compares a voltage at a node with a threshold voltage. The dynamic strobe component 150, in certain embodiments, is embodied as software in a device driver, hardware in a device controller 244, and/or hardware in a die controller 220 and/or state machine 222.

In one embodiment, one or any combination of die controller 220, dynamic strobe component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
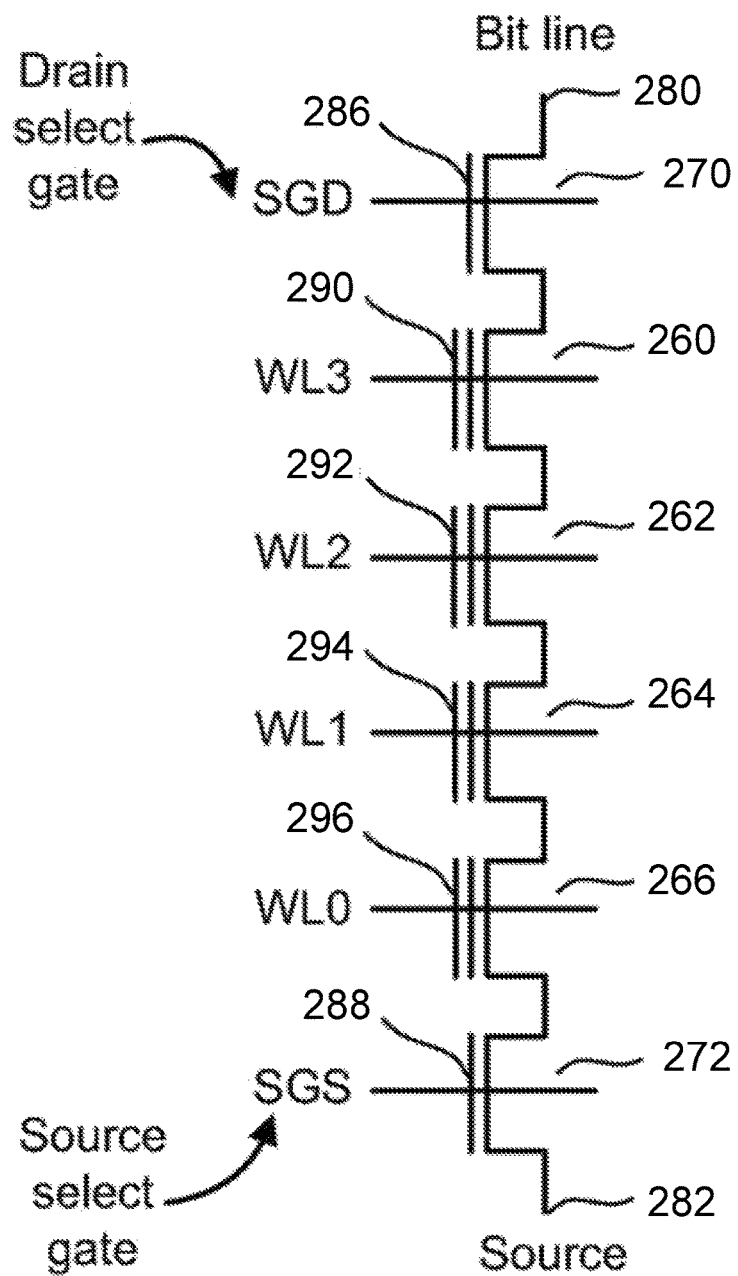
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the dynamic strobe component 150 controls a duration of a strobe signal for sensing data for the storage elements 260, 262, 264, 266 (e.g., a read voltage, read current, and/or another read level). The duration of the strobe signal may be controlled based on a voltage at a node used for sensing data for the storage elements 260, 262, 264, 266.

Figure 3:
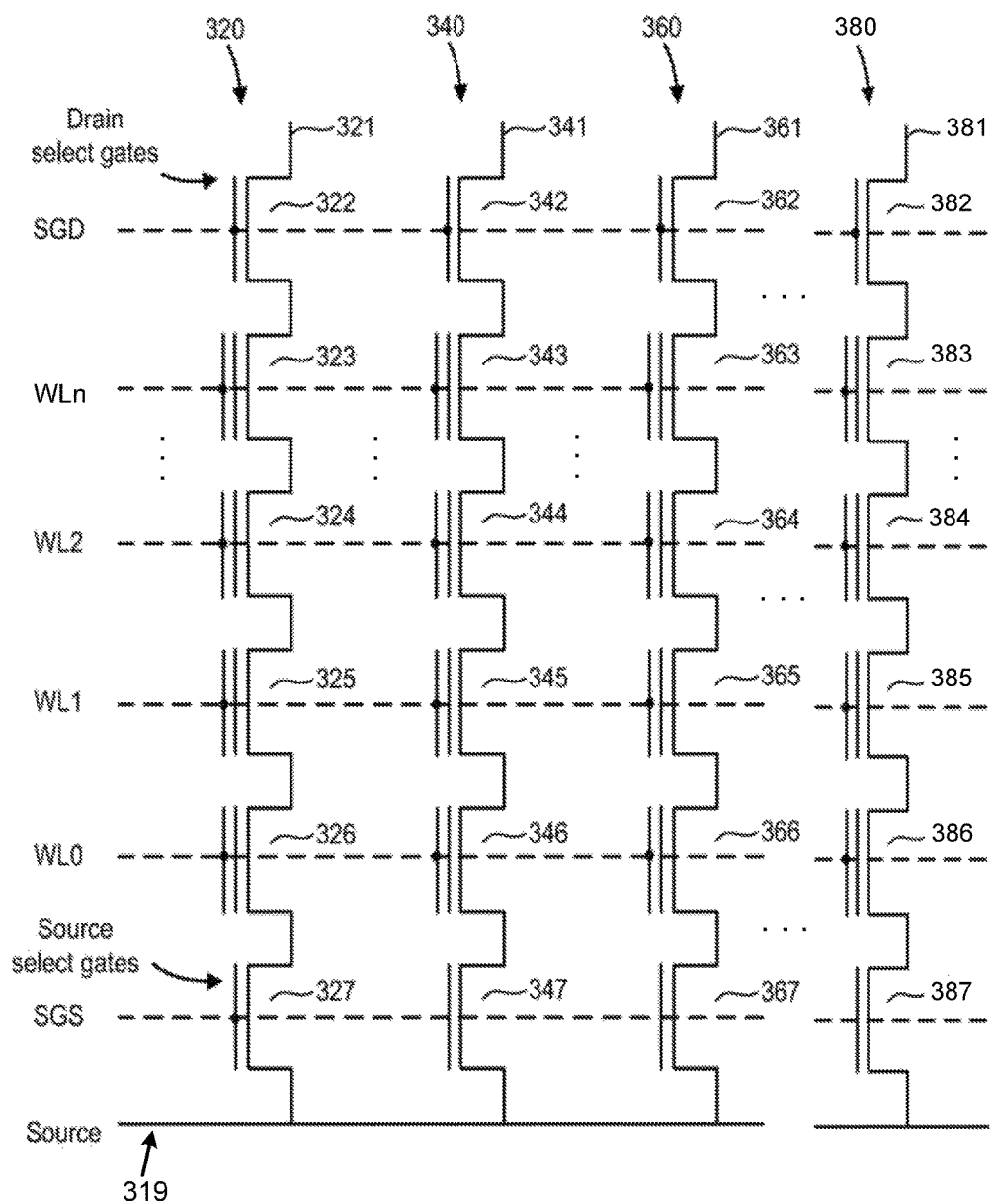
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, a duration of a strobe signal used for sensing data on the storage elements 323-326, 343-346, 363-366, 383-386 may be longer than necessary resulting in excessive sensing time, increased power consumption, and/or reduced sensing accuracy. In such an embodiment, the dynamic strobe component 150 may control the duration of the strobe signal used for sensing data on the storage elements 323-326, 343-346, 363-366, 383-386 based on feedback that results from initiation of the strobe signal.

Figure 4:
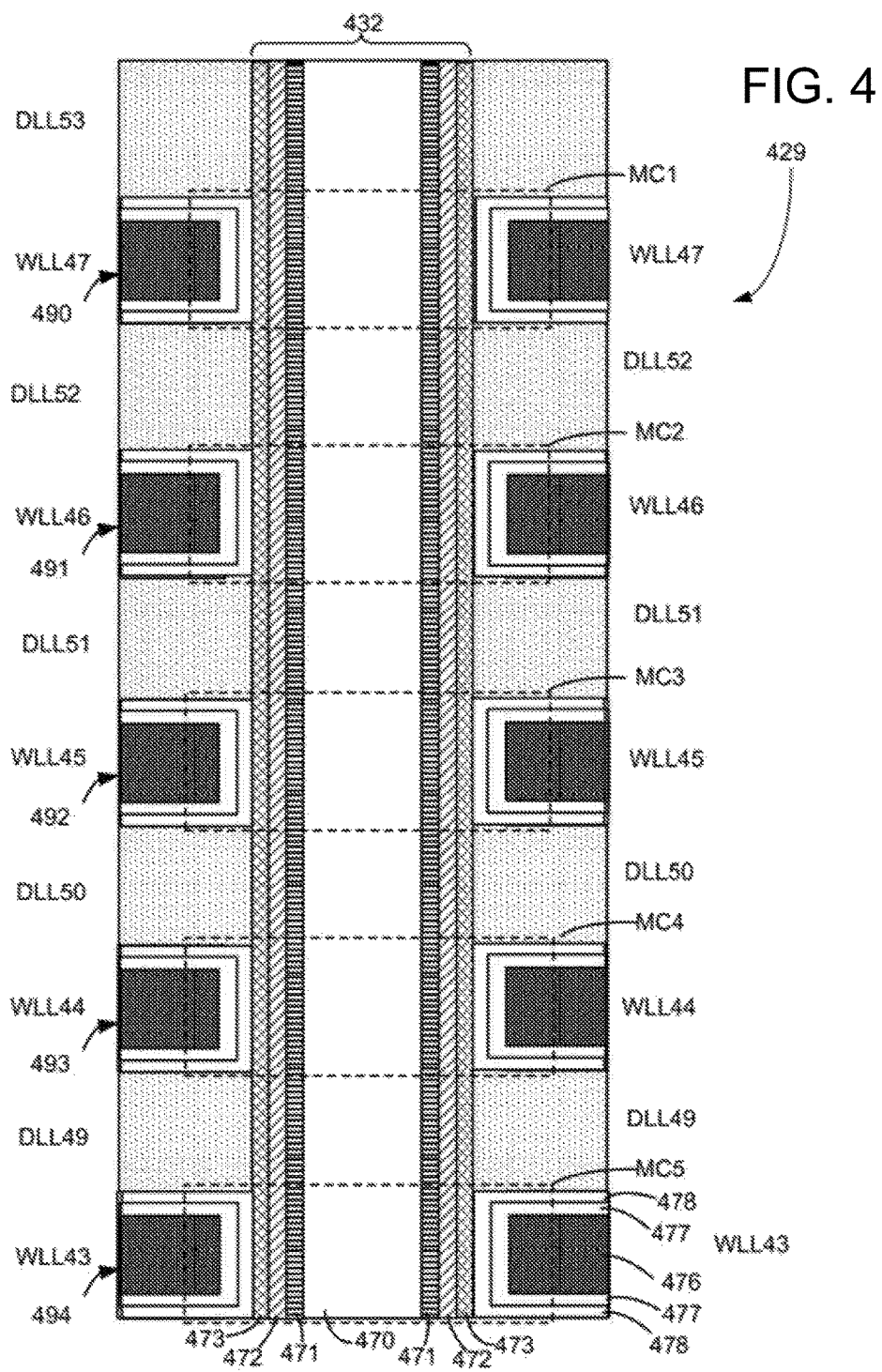
FIG. 4 illustrates one embodiment of a 3D, vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide ($SiO_2$) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
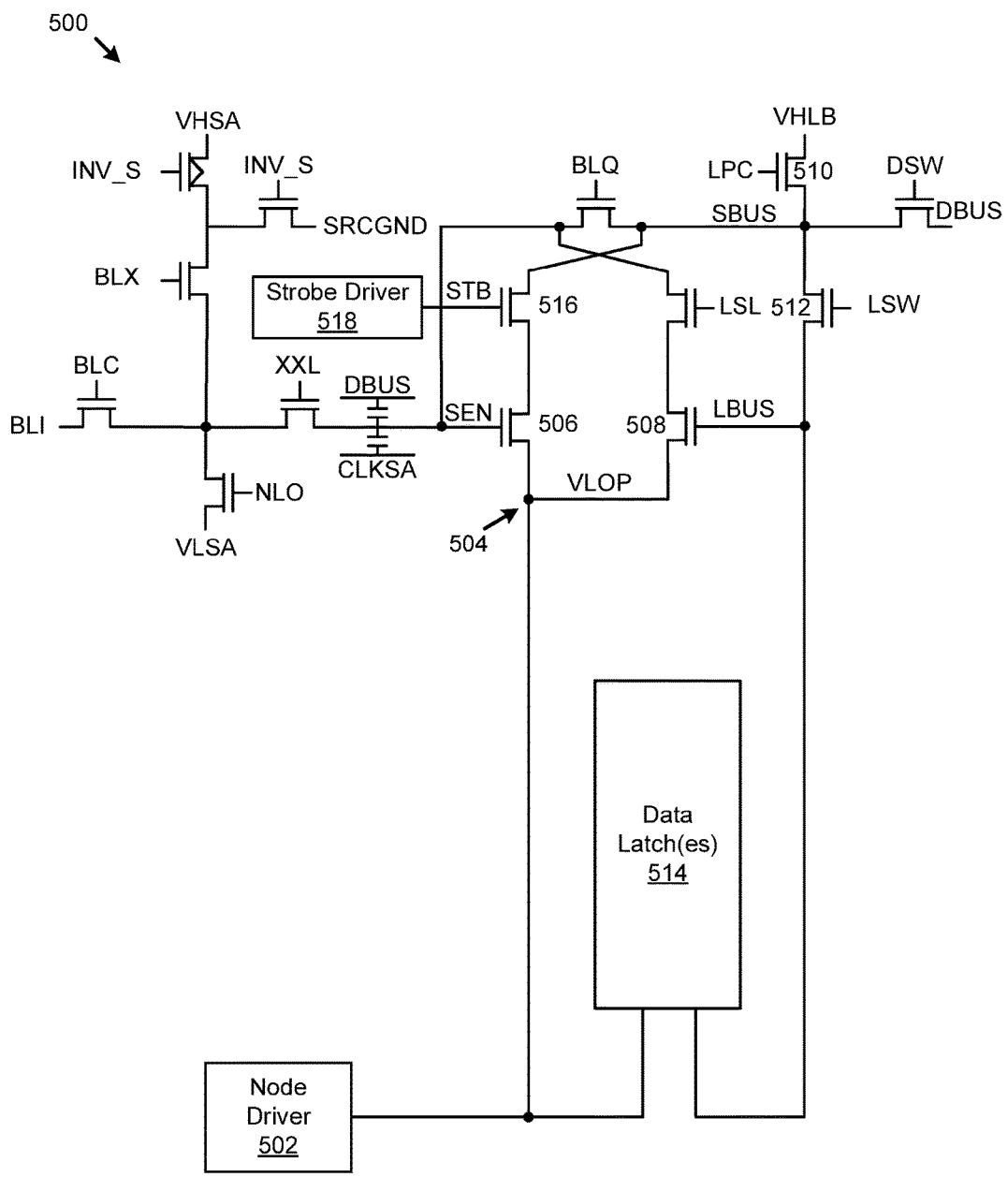
FIG. 5 is a schematic block diagram illustrating one embodiment of circuitry that may use dynamic strobe timing.

FIG. 5 is a schematic block diagram illustrating one embodiment of circuitry 500 that may use dynamic strobe timing. In certain embodiments, the circuitry 500 may be part of circuitry for a sense amplifier of the non-volatile memory device 120. In some embodiments, a portion of the circuitry 500 is part of a sense amplifier, and a portion of the circuitry 500 is outside (e.g., next to, adjacent to) the sense amplifier. For example, a detection block may be next to a sense amplifier, but may be used for an entire plane, an entire die, or the like with multiple sense amplifiers, without duplicating the detection block for each sense amplifier.

The circuitry 500 includes a node driver 502 that drives a node 504 to a voltage ("VLOP"). The node driver 502 may drive the node 504 to any suitable VLOP, such as an initial voltage. For example, in one embodiment, the node driver 502 may drive the node 504 to a VLOP of approximately 0.0, 0.1, 0.2, 0.3, 0.4, 0.5, or 0.6 volts. In some embodiments, the node driver 502 may drive the node 504 to a VLOP in a range of 0.0 to 0.5 volts. The term "initial voltage" may mean a voltage setting for a device or node at the start of a method or procedure, a first voltage setting for a device or node at the start of a method or procedure, a voltage change for a device or node during an operation, and/or a first voltage setting for a device or node during a method or procedure. For example, in one embodiment, driving the node 504 to an initial voltage may include changing a voltage of the node 504 from approximately 0.0 volts to an initial voltage of approximately 0.3 volts. As another example, driving the node 504 to an initial voltage may include setting the voltage of the node 504 to approximately 0.4 volts from any prior voltage. With the node 504 at the initial voltage, the circuitry 500 may be enabled for strobing. The VLOP may be used for any suitable purpose. For example, VLOP may be used for source bias sensing (as described herein). As another example, VLOP may be set to VSS when source bias sensing is not used. As a further example, VLOP may be biased to a dc voltage (e.g., approximately 0.2 volts) for Vt tracking of SEN, or the like.

The node 504, as illustrated, is common to a source/drain of a sense ("SEN") transistor 506 and a source/drain of a local bus ("LBUS") transistor 508. Accordingly, the VLOP is common to the source/drain of the SEN transistor 506 and the source/drain of the LBUS transistor 508.

During operation of the circuitry 500, an LBUS precharge ("LPC") transistor 510 may be activated by a first LPC gate signal and an LBUS switch ("LSW") transistor 512 may be activated by a first LSW gate signal to precharge a sense bus ("SBUS"). The LPC transistor 510 may be activated by a second LPC gate signal and the LSW transistor 512 may be activated by a second LSW gate signal to precharge the LBUS. Upon proper activation of the LPC transistor 510 and the LSW transistor 512, an LBUS signal is supplied to one or more data latches 514 for storage by the one or more data latches 514. Moreover, a strobe ("STB") enabling transistor 516 is activated by a STB gate signal (e.g., strobe signal) produced by a strobe driver 518. The STB gate signal may facilitate reading memory cells of the non-volatile memory device 120. The STB enabling transistor 516 may be any type of transistor that facilitates enabling the circuitry 500 for strobing. For example, the STB enabling transistor 516 may be a bipolar junction transistor, a field effect transistor, a junction field effect transistor, a metal oxide field effect transistor, or another type of transistor.

The strobe driver 518 controls a duration of the STB gate signal to determine a duration that strobing occurs for activating the circuitry 500 for sensing data in the non-volatile memory device 120. In some embodiments, the strobe driver 518 may receive a control signal that provides feedback to the strobe driver 518 to facilitate the strobe driver 518 determining when to start and/or end the STB gate signal.

Figure 6:
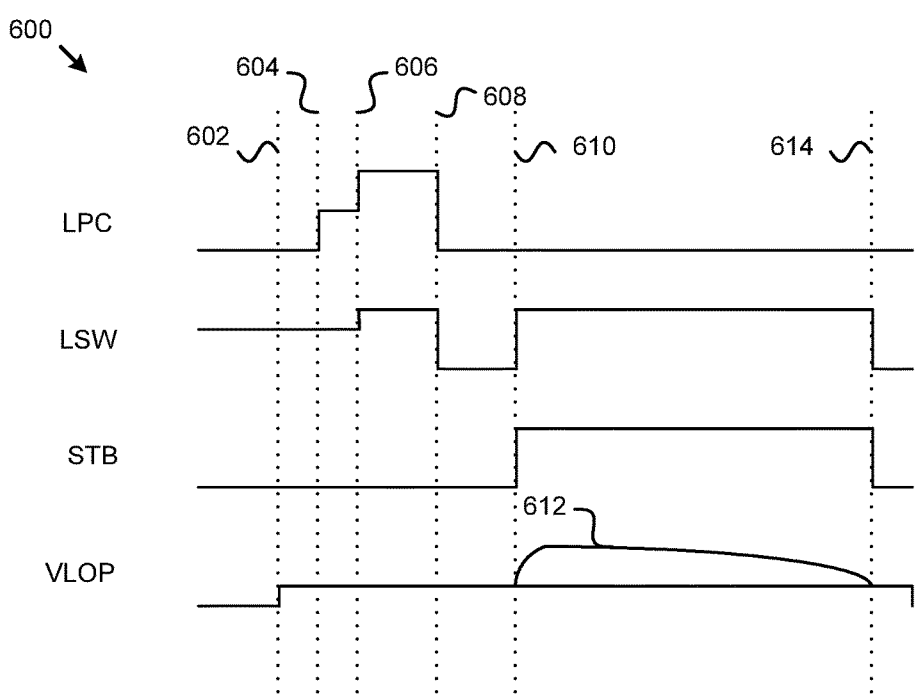
FIG. 6 is a timing diagram illustrating one embodiment of signal timing for circuitry that may use dynamic strobe timing.

The operation of the circuitry 500 is described below in conjunction with FIG. 6. FIG. 6 is a timing diagram illustrating one embodiment of signal timing 600 for the circuitry 500 that may use dynamic strobe timing. Specifically, during operation of the circuitry 500, at a first time 602 the node driver 502 drives the node 504 to a VLOP (e.g., an initial voltage such as 0.3 volts). At a second time 604, a first LPC voltage is supplied to the gate of the LPC transistor 510 and a first LSW voltage is supplied to the gate of the LSW transistor 512 to facilitate precharging the SBUS. The first LPC voltage may be any suitable voltage that facilitates precharging the SBUS, such as a sense amplifier supply voltage ("VDDSA"). Moreover, the first LSW voltage may be any suitable voltage that facilitates precharging the SBUS, such as a supply voltage ("VDD").

At a third time 606, a second LPC voltage is supplied to the gate of the LPC transistor 510 and a second LSW voltage is supplied to the gate of the LSW transistor 512 to facilitate precharging the LBUS. The second LPC voltage may be any suitable voltage that facilitates precharging the LBUS, such as a voltage greater than VDDSA. Moreover, the second LSW voltage may be any suitable voltage that facilitates precharing the LBUS, such as a voltage greater than VDD. In some embodiments, the SBUS and the LBUS are precharged at the same time (e.g., the second time 604 and/or the third time 606). In other embodiments, the SBUS and the LBUS may be precharged at different times.

At a fourth time 608, a third LPC voltage is supplied to the gate of the LPC transistor 510 and a third LSW voltage is supplied to the gate of the LSW transistor 512 to complete precharging. The third LPC voltage and the third LSW voltage may each be any suitable voltage that end precharging. In one embodiment, the third LPC voltage and the third LSW voltage may each be a source supply voltage ("VSS").

At a fifth time 610, strobing initiates in response to the second LSW voltage being supplied to the gate of the LSW transistor 512 and a strobe voltage being supplied to the gate of the STB enabling transistor 516. The strobe voltage may be any suitable voltage that initiates strobing. In response to the strobe voltage being supplied to the gate of the STB transistor 516, a transient voltage 612 occurs at the node 504 altering the VLOP.

The transient voltage 612 occurs at the node 504 in response to discharge of the SEN transistor 506 and the LBUS transistor 508. The transient voltage 612 begins at the fifth time 610, increases to a peak voltage, then decreases to return the VLOP to the initial voltage set at the first time 602. In certain embodiments, the transient voltage 612 may decrease to a trough voltage, then increase to return the VLOP to the initial voltage set at the first time 602.

At a sixth time 614, strobing ends in response to no longer supplying the second LSW voltage to the gate of the LSW transistor 512 and no longer supplying the strobe voltage to the gate of the STB enabling transistor 516. The duration of strobing between the fifth time 610 and the sixth time 614 may vary based on a variety of triggers, such as a feedback signal, a fixed setting of the strobe driver 518, and so forth. In some embodiments, the transient voltage 612 may be used to determine a duration of the strobe voltage being supplied to the gate of the STB enabling transistor 516 to dynamically control strobe timing.

Figure 7:
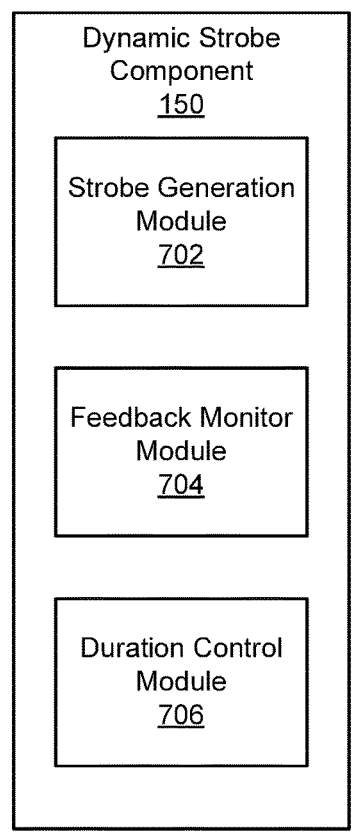
FIG. 7 is a schematic block diagram illustrating one embodiment of a dynamic strobe component.

FIG. 7 depicts one embodiment of a dynamic strobe component 150. The dynamic strobe component 150 may be substantially similar to the dynamic strobe component 150 described above with regard to FIGS. 1A, 1B, 2, and/or 3. In general, as described above, the dynamic strobe component 150 generates a strobe signal to facilitate data transfer, receives a feedback signal in response to initiation of the strobe signal, and controls a duration of the strobe signal based on the feedback signal. In the depicted embodiment, the dynamic strobe component 150 includes a strobe generation module 702, a feedback monitor module 704, and a duration control module 706.

In various embodiments, the strobe generation module 702 generates a strobe signal to facilitate data transfer (e.g., reading, writing, and/or verifying data). As used herein, a "strobe signal" may refer to any signal that is used to validate data or other signals and/or any signal that provides a timing window for an event to occur. In certain embodiments, the strobe generation module 702 generates the strobe signal to sense data during a data read process, a data write process, and/or a data verify process. In some embodiments, the strobe generation module 702 generates the strobe signal for a predetermined duration based on a default duration. Generating a strobe signal may include outputting a strobe enable signal, outputting a voltage, outputting a pulse, and so forth.

In certain embodiments, the strobe generation module 702 ends (e.g., terminates) the strobe signal based on a default duration. In various embodiments, a default duration may be a maximum duration for strobing a particular circuit. For example, the maximum duration may be approximately 350 ns or 700 ns. In one embodiment, the strobe generation module 702 may generate a strobe signal that is supplied to a gate of a STB transistor, such as the STB enabling transistor 516.

In certain embodiments, the feedback monitor module 704 receives a feedback signal in response to initiation of a strobe signal. The feedback signal may be any suitable signal useful to indicate when the strobe signal should end. Initiation of the strobe signal may refer to the start of the strobe signal, a voltage of the strobe signal passing a predetermined voltage, and so forth. In some embodiments, the feedback signal is produced in response to a change in voltage at a node common to multiple transistors. In certain embodiments, the node common to multiple transistors may be the node 504 that is common to the SEN transistor 506 and the LBUS transistor 508. In various embodiments, the change in voltage at the node common to the multiple transistors results from initiation of the strobe signal. In one embodiment, the change in voltage at the node changes the voltage at the node from an initial voltage to a transient voltage. In such an embodiment, the transient voltage spikes (e.g., increases to a peak voltage, decreases from a trough voltage) at initiation of the strobe signal and transitions from the spike toward the initial voltage. In certain embodiments, the feedback signal may be produced by the transient voltage and/or may be the transient voltage.

It should be noted that the node 504 may be used for multiple purposes. Specifically, the node 504 may be used to provide a common voltage to a source/drain of the SEN transistor 506 and the LBUS transistor 508. Furthermore, the node 504 may be used to provide the feedback signal due to the change in voltage at the node from the initial voltage to the transient voltage. The change in voltage at the node is illustrated, in one embodiment, in FIG. 6 via the transient voltage 612 that is at the node 504.

In some embodiments, the duration control module 706 controls a duration of the strobe signal based on the feedback signal. The duration of the strobe signal may be a length of time that the strobe signal lasts. Controlling the duration of the strobe signal may mean initiating the strobe signal, ending the strobe signal, and/or determining a length of time for the strobe signal. In one embodiment, the duration control module 706 controls the duration of the strobe signal in response to the feedback signal satisfying a threshold based on a bias signal. Satisfying a threshold may mean being above a threshold, being below a threshold, reaching the threshold, and/or passing the threshold. For example, in one embodiment, the duration control module 706 controls the strobe signal to continue in response to the VLOP at the node 504 being greater than a threshold (e.g., a threshold voltage, a bias voltage). As another example, in one embodiment, the duration control module 706 controls the strobe signal to end (e.g., terminate) in response to the VLOP at the node 504 being less than the threshold. A bias signal may be any suitable signal useful for determining when the strobe signal should begin and/or end. In various embodiments, the bias signal may be used as the threshold for comparison with the VLOP to determine whether the strobe signal should end. In some embodiments, by controlling the duration of the strobe signal, the strobe signal may be reduced as compared to a default duration. For example, the strobe signal may be reduced by approximately 10%, 20%, 50%, 70%, 80%, or 90%. By reducing the length of the strobe signal, sensing accuracy of a sensing amplifier circuit may be increased.

Figure 8:
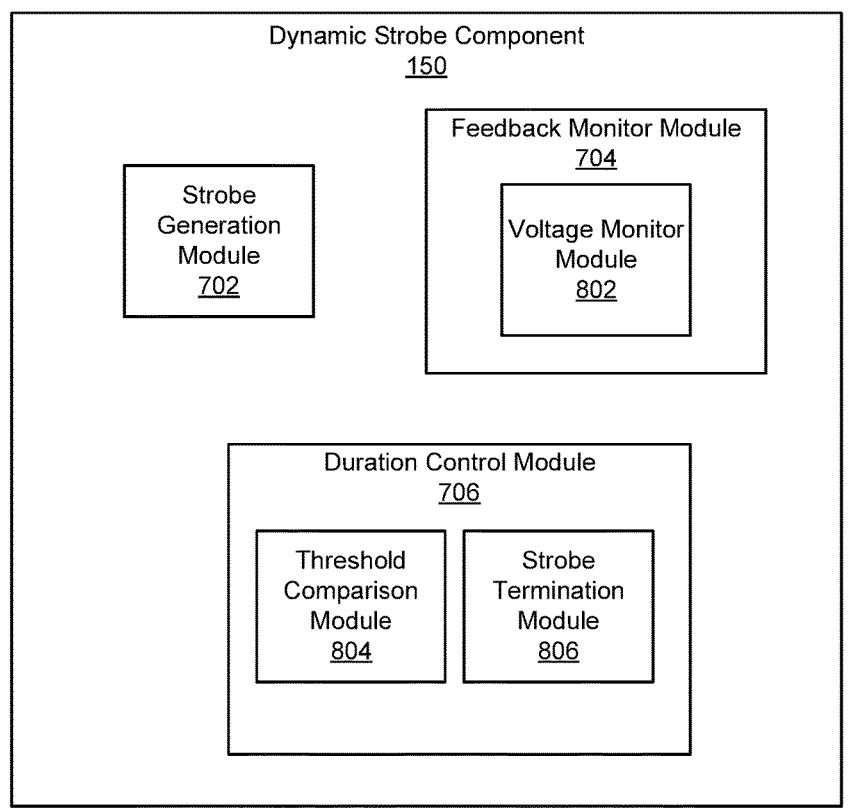
FIG. 8 is a schematic block diagram illustrating a further embodiment of a dynamic strobe component.

Turning to FIG. 8, a further embodiment of a dynamic strobe component 150 is illustrated. The dynamic strobe component 150 may be substantially similar to the dynamic strobe component 150 described above with regard to FIGS. 1A, 1B, 2, 3, and/or 7. In the depicted embodiment, the dynamic strobe component 150 includes the strobe generation module 702, the feedback monitor module 704, and the duration control module 706 and further includes a voltage monitor module 802, a threshold comparison module 804, and a strobe termination module 806.

In one embodiment, the voltage monitor module 802 may include a voltage monitor that monitors a magnitude of a feedback signal and stops generating the strobe signal in response to the magnitude of the feedback signal crossing a threshold. A threshold may be a value that is predetermined to identify a time to stop generation of the strobe signal when the feedback signal reaches the threshold. For example, in one embodiment, the voltage monitor module 802 may monitor a magnitude of VLOP and may direct the duration control module 706 to stop generation of the strobe signal in response to the magnitude of VLOP crossing a threshold (e.g., a bias voltage). As used herein, "crossing a threshold" may mean passing the threshold, going from below the threshold to above the threshold, going from above the threshold to below the threshold, and so forth.

In certain embodiments, the threshold comparison module 804 includes a comparator that compares a feedback signal to a bias signal. In some embodiments, the comparator may output a control signal for controlling the duration of the strobe signal. For example, in one embodiment, the comparator may output a control signal to direct the strobe signal to continue in response to the feedback signal satisfying a threshold based on a bias signal. As another example, the comparator may output a control signal to direct the strobe signal to end in response to the feedback signal failing to satisfy a threshold based on the bias signal. In some embodiments, a threshold may be satisfied if the feedback signal equals the threshold. In contrast, in various embodiments, a threshold may be unsatisfied if a feedback signal is greater than or less than the threshold. In certain embodiments, the strobe termination module 806 may direct a strobe driver (e.g., the strobe driver 518) to end the strobe signal. For example, the strobe termination module 806 may output a control signal used to direct the strobe driver to end the strobe signal.

Figure 9:
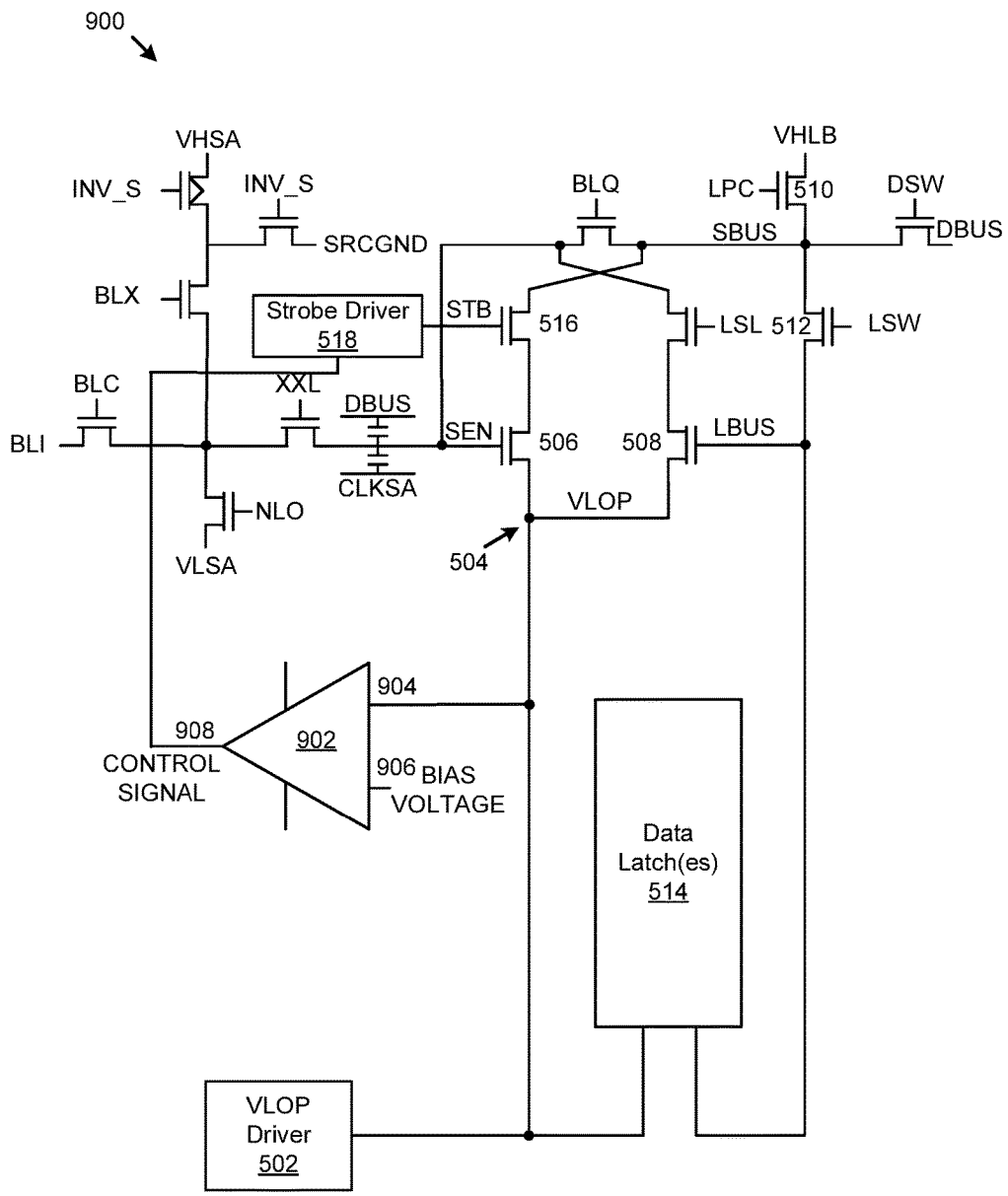
FIG. 9 is a schematic block diagram illustrating one embodiment of circuitry using dynamic strobe timing.

FIG. 9 is a schematic block diagram illustrating one embodiment of circuitry 900 using dynamic strobe timing. The circuitry 900 may be substantially similar to the circuitry 500 of FIG. 5 with the addition of a comparator 902. In some embodiments, a portion of the circuitry 900 is part of a sense amplifier, and a portion of the circuitry 900 is outside (e.g., next to, adjacent to) the sense amplifier. For example, in one embodiment, the comparator 902 is part of a sense amplifier, while, in another embodiment, the comparator 902 is positioned outside of the sense amplifier. In certain embodiments, there may be only one comparator 902 for multiple sense amplifiers (e.g., for an entire plane, an entire die, an entire chip, or the like, so as not to unnecessarily duplicate circuitry). The comparator 902 may be any suitable type of device capable of comparing two inputs and producing an output based on a comparison between the two inputs. For example, the comparator 902 may be an amplifier, an operational amplifier, a logic gate, a combination of logic gates, a circuit, and so forth. The comparator 902 includes a first input 904 and a second input 906 and an output 908. The output 908 is produced as a result of the comparison between the first input 904 and the second input 906.

In one embodiment, the first input 904 is coupled to the node 504 and the second input 906 is tied to a bias voltage. The bias voltage may be any suitable voltage. For example, the bias voltage may be approximately 0.0, 0.1, 0.2, 0.3, or 0.4 volts. The comparator 902 determines whether the VLOP at the node 504 is greater than the bias voltage. Moreover, the comparator 902 outputs a control signal via the output 908. The control signal is coupled to the strobe driver 512 to facilitate directing the strobe driver 512 to continue to apply a strobe signal or to end application of the strobe signal (e.g., terminate the strobe signal).

For example, in one embodiment, if the VLOP is greater than the bias voltage, the control signal may indicate to the strobe driver 512 to continue to supply the strobe signal. In contrast, in such an embodiment, if the VLOP is less than the bias voltage, the control signal may indicate to the strobe driver 512 to end supplying the strobe signal. In various embodiments, the control signal may be a logic low, a logic high, a "1", a "0", an analog signal, and/or a digital signal.

In another embodiment, if the VLOP is less than the bias voltage, the control signal may indicate to the strobe driver 512 to continue to supply the strobe signal. Further, in such an embodiment, if the VLOP is greater than the bias voltage, the control signal may indicate to the strobe driver 512 to end supplying the strobe signal.

Figure 10:
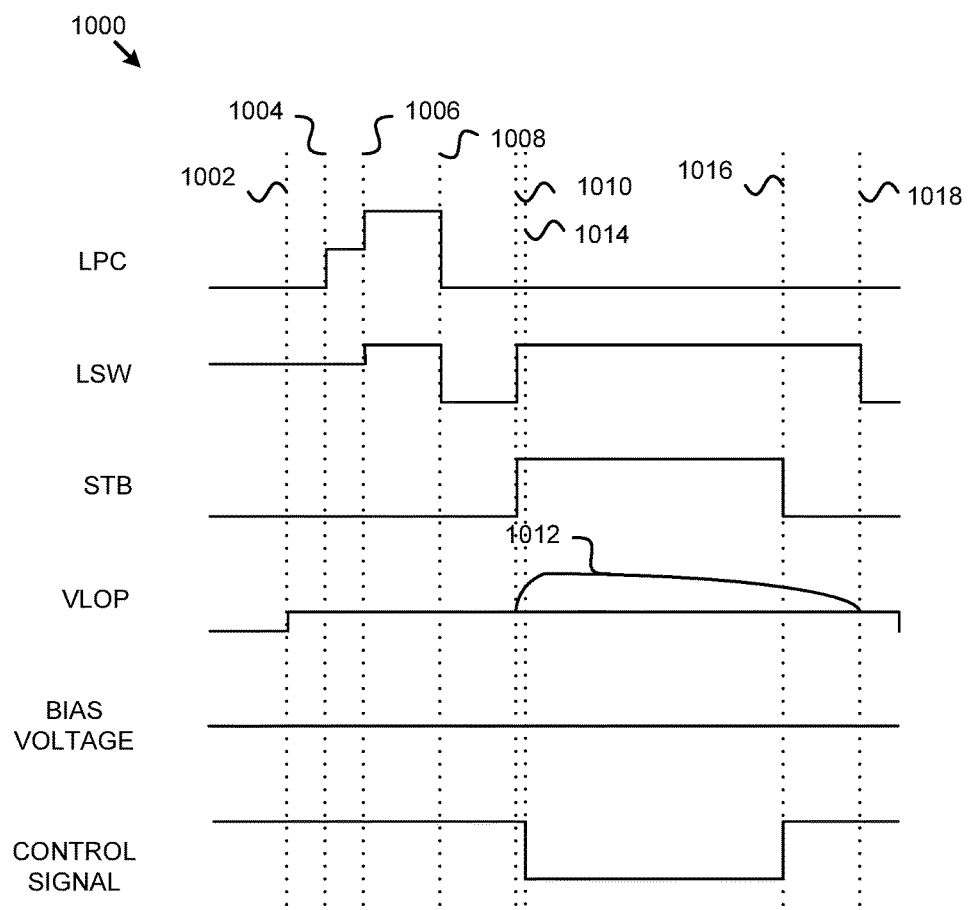
FIG. 10 is a timing diagram illustrating one embodiment of signal timing for circuitry that uses dynamic strobe timing.

The operation of the circuitry 900 is described below in conjunction with FIG. 10. FIG. 10 is a timing diagram illustrating one embodiment of signal timing 1000 for the circuitry 900 that uses dynamic strobe timing. Specifically, during operation of the circuitry 900, at a first time 1002 the node driver 502 drives the node 504 to a VLOP (e.g., an initial voltage such as 0.3 volts). At a second time 1004, a first LPC voltage is supplied to the gate of the LPC transistor 510 and a first LSW voltage is supplied to the gate of the LSW transistor 512 to facilitate precharging the SBUS. The first LPC voltage may be any suitable voltage, such as a VDDSA. Moreover, the first LSW voltage may be any suitable voltage, such as a VDD.

At a third time 1006, a second LPC voltage is supplied to the gate of the LPC transistor 510 and a second LSW voltage is supplied to the gate of the LSW transistor 512 to facilitate precharging the LBUS. The second LPC voltage may be any suitable voltage, such as a voltage greater than VDDSA. Moreover, the second LSW voltage may be any suitable voltage, such as a voltage greater than VDD.

At a fourth time 1008, a third LPC voltage is supplied to the gate of the LPC transistor 510 and a third LSW voltage is supplied to the gate of the LSW transistor 512 to complete precharging. The third LPC voltage and the third LSW voltage may each be any suitable voltage. In one embodiment, the third LPC voltage and the third LSW voltage may each be a VSS.

At a fifth time 1010, strobing initiates in response to the second LSW voltage being supplied to the gate of the LSW transistor 512 and a strobe voltage being supplied to the gate of the STB enabling transistor 516. The strobe voltage may be any suitable voltage. In response to the strobe voltage being supplied to the gate of the STB transistor 516, a transient voltage 1012 occurs at the node 504 altering the VLOP.

At a sixth time 1014 the VLOP increases above a bias voltage resulting in the control signal at the output 908 of the comparator 902 transitioning from a logic high to a logic low.

At a seventh time 1016, the VLOP drops below the bias voltage resulting in the control signal at the output 908 of the comparator 902 transitioning from a logic low to a logic high. This transition from logic low to logic high signals to the strobe driver 518 to end strobing. Accordingly, at the seventh time 1016, the strobing ends in response to no longer supplying the second LSW voltage to the gate of the LSW transistor 512 and no longer supplying the strobe voltage to the gate of the STB enabling transistor 516. At an eighth time 1018 the transient voltage is no longer on the node 504 resulting in VLOP returning to its initial voltage supplied at the first time 1002.

Figure 11:
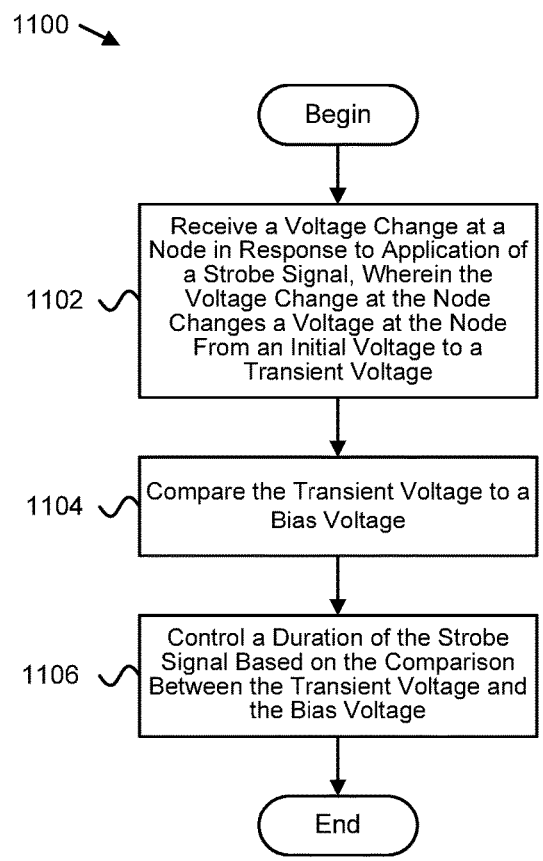
FIG. 11 is a schematic flow chart diagram illustrating one embodiment of a method for dynamic strobe timing.

FIG. 11 depicts one embodiment of a method 1100 for dynamic strobe timing. The method 1100 may be performed each time that a strobe signal is provided.

The method 1100 begins and the feedback monitor module 704 receives 1102 a voltage change at a node in response to application of a strobe signal. The voltage change at the node changes a voltage at the node from an initial voltage to a transient voltage. The feedback monitor module 704 compares 1104 the transient voltage to a bias voltage. The duration control module 706 controls 1106 a duration of the strobe signal based on the comparison between the transient voltage and the bias voltage, and the method 1100 ends.

In some embodiments, the strobe generation module 702 applies the strobe signal to a set of non-voltage storage cells for reading the set of non-volatile storage cells. In various embodiments, the duration control module 706 outputs a control signal that controls the duration of the strobe signal based on the comparison between the transient voltage and the bias voltage. In certain embodiments, the duration control module 706 directs the strobe signal to continue in response to the transient voltage being greater than the bias voltage. In some embodiments, the strobe termination module 806 directs the strobe signal to end in response to the transient voltage being less than the bias voltage.

Figure 12:
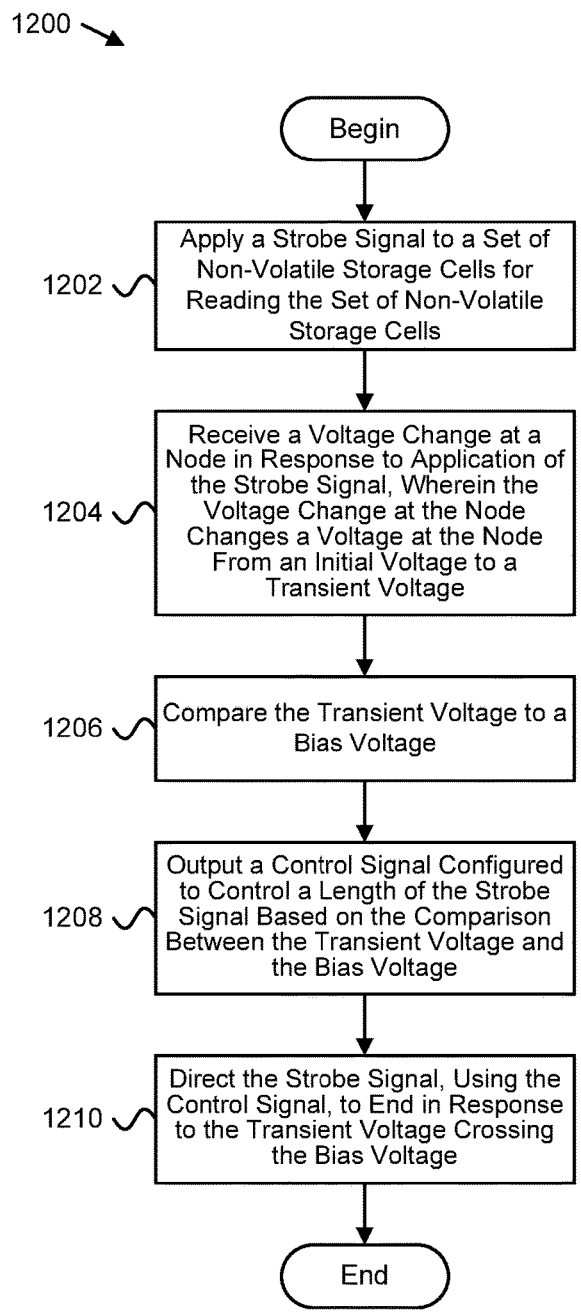
FIG. 12 is a schematic flow chart diagram illustrating a further embodiment of a method for dynamic strobe timing.

FIG. 12 is a schematic flow chart diagram illustrating a further embodiment of a method 1200 for dynamic strobe timing. The method 1200 begins, and the strobe generation module 702 applies 1202 a strobe signal to a set of non-voltage storage cells for reading the set of non-volatile storage cells. Moreover, the voltage monitor module 802 receives 1204 a voltage change at a node in response to application of the strobe signal. The voltage change at the node changes a voltage at the node from an initial voltage to a transient voltage. The threshold comparison module 804 compares 1206 the transient voltage to a bias voltage. The duration control module 706 outputs 1208 a control signal that controls the duration of the strobe signal based on the comparison between the transient voltage and the bias voltage. The strobe termination module 806 directs 1210 the strobe signal, using the control signal, to end in response to the transient voltage crossing the bias voltage, and the method 1200 ends.

A means for detecting a voltage change at a node in response to initiation of a strobe signal, in various embodiments, may include one or more of a dynamic strobe component 150, a feedback monitor module 704, a voltage monitor module 802, a state machine 222, a sense block 250, circuitry 500, a comparator, a transistor, a controller, a non-volatile memory medium controller 126, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for detecting a voltage change at a node in response to initiation of a strobe signal. In certain embodiments, the voltage change at the node changes a voltage at the node from an initial voltage to a transient voltage.

A means for determining a relationship between a transient voltage and a threshold voltage, in various embodiments, may include a dynamic strobe component 150, a feedback monitor module 704, a duration control module 706, a state machine 222, a sense block 250, circuitry 500, a comparator, a transistor, a controller, a non-volatile memory medium controller 126, a voltage monitor module 802, a threshold comparison module 804, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for determining a relationship between a transient voltage and a threshold voltage.

A means for terminating a strobe signal based on a relationship between a transient voltage and a threshold voltage, in various embodiments, may include a dynamic strobe component 150, a duration control module 706, a strobe termination module 806, a state machine 222, a sense block 250, circuitry 500, a comparator, a transistor, a controller, a non-volatile memory medium controller 126, a host computing device 110, a device driver, a controller (e.g., a device driver) executing on a host computing device 110, a processor 111, an FPGA, an ASIC, other logic hardware, and/or other executable code stored on a computer readable storage medium. Other embodiments may include similar or equivalent means for terminating the strobe signal based on the relationship between the transient voltage and the threshold voltage.

A means for outputting a control signal configured to terminate a strobe signal based on a relationship between a transient voltage and a threshold voltage, in various embodiments, may include a dynamic strobe component 150, a duration control module 706, a strobe termination module 806, a state machine 222, a sense block 250, circuitry 500, a comparator, a transistor, a controller, a non-volatile memory medium controller 126, a host computing device 110, a device driver, a controller (e.g., a device driver) executing on a host computing device 110, a processor 111, an FPGA, an ASIC, other logic hardware, and/or other executable code stored on a computer readable storage medium. Other embodiments may include similar or equivalent means for outputting a control signal configured to terminate a strobe signal based on a relationship between a transient voltage and a threshold voltage.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    a controller configured to,
        generate a strobe signal to facilitate data transfer;
        receive a feedback signal in response to initiation of the strobe signal;
        control a duration of the strobe signal based on the feedback signal; and
        apply the strobe signal to read a set of non-volatile storage cells during the duration of the strobe signal.

2. The apparatus of claim 1, wherein the controller further comprises a voltage monitor that monitors a magnitude of the feedback signal and stops generating the strobe signal in response to the magnitude of the feedback signal crossing a threshold.

3. The apparatus of claim 1, wherein the controller is configured to control the duration of the strobe signal in response to the feedback signal satisfying a threshold based on a bias signal.

4. The apparatus of claim 1, wherein the controller further comprises a comparator configured to compare the feedback signal to a bias signal.

5. The apparatus of claim 4, wherein the comparator is configured to output a control signal for controlling the length of the strobe signal.

6. The apparatus of claim 4, wherein the comparator is configured to output a control signal to direct the strobe signal to continue in response to the feedback signal satisfying a threshold based on the bias signal.

7. The apparatus of claim 4, wherein the comparator is configured to output a control signal to direct the strobe signal to end in response to the feedback signal being failing to satisfy a threshold based on the bias signal.

8. The apparatus of claim 5, wherein the controller further comprises a strobe driver configured to end the strobe signal in response to receiving the control signal.

9. The apparatus of claim 1, wherein the feedback signal is produced in response to a change in voltage at a node common to a plurality of transistors.

10. The apparatus of claim 9, wherein the change in voltage at the node results from initiation of the strobe signal.

11. The apparatus of claim 9, wherein the change in voltage at the node changes the voltage at the node from an initial voltage to a transient voltage.

12. The apparatus of claim 11, wherein the transient voltage spikes at initiation of the strobe signal and transitions from the spike toward the initial voltage.

13. An apparatus comprising:
a node driver configured to drive a sense amplifier node to an initial voltage;
a strobe enabling transistor configured to receive a strobe signal to facilitate reading memory cells of a set of non-volatile memory cells with the node at the initial voltage;
a strobe driver configured to provide the strobe signal to the strobe enabling transistor; and
a comparator configured to compare a voltage at the node with a bias voltage, wherein, in response to the voltage at the node passing the threshold voltage, the comparator is configured to output a control signal to the strobe driver to end providing the strobe signal to the strobe enabling transistor.

14. The apparatus of claim 13, wherein the voltage at the node is used as an input to the comparator and for another purpose in the set of non-volatile memory cells.

15. The apparatus of claim 13, wherein the voltage at the node transitions from the initial voltage to a transient voltage in response to the strobe driver providing the strobe signal to the strobe enabling transistor.

16. A method comprising:
receiving a voltage change at a node in response to application of a strobe signal, wherein the voltage change at the node changes a voltage at the node from an initial voltage to a transient voltage and the strobe signal is used to read non-volatile storage cells;
comparing the transient voltage to a bias voltage; and
controlling a length of the strobe signal based on the comparison between the transient voltage and the bias voltage.

17. The method of claim 16, further comprising applying the strobe signal to a set of non-volatile storage cells for reading the set of non-volatile storage cells.

18. The method of claim 16, further comprising outputting a control signal configured to control the length of the strobe signal based on the comparison between the transient voltage and the bias voltage.

19. The method of claim 18, wherein the control signal directs the strobe signal to continue in response to the transient voltage being greater than the bias voltage.

20. The method of claim 18, wherein the control signal directs the strobe signal to end in response to the transient voltage being less than the bias voltage.

21. An apparatus comprising:
means for detecting a voltage change at a node in response to initiation of a strobe signal, wherein the voltage change at the node changes a voltage at the node from an initial voltage to a transient voltage and the strobe signal is used for sensing data stored by non-volatile storage cells;
means for determining a relationship between the transient voltage and a threshold voltage; and
means for terminating the strobe signal based on the relationship between the transient voltage and the threshold voltage.

22. The apparatus of claim 21, further comprising means for outputting a control signal configured to terminate the strobe signal based on the relationship between the transient voltage and the threshold voltage.

* * * * *